United States Patent
Zur

(10) Patent No.: US 7,375,519 B2
(45) Date of Patent: May 20, 2008

(54) METHOD AND APPARATUS OF MR IMAGING WITH TWO DIMENSIONAL PHASE AND MAGNITUDE CORRECTION

(75) Inventor: Yuval Zur, Haifa (IL)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/379,395

(22) Filed: Apr. 20, 2006

(65) Prior Publication Data

US 2007/0247151 A1    Oct. 25, 2007

(51) Int. Cl.
*G01V 3/00*    (2006.01)

(52) U.S. Cl. ..................................... 324/307

(58) Field of Classification Search ......... 324/300–322
See application file for complete search history.

(56) References Cited

U.S. PATENT DOCUMENTS

| 5,068,609 | A |   | 11/1991 | Bruder et al. |         |
|-----------|---|---|---------|---------------|---------|
| 5,459,400 | A | * | 10/1995 | Moonen        | 324/309 |
| 5,818,229 | A | * | 10/1998 | Kanazawa      | 324/309 |
| 5,833,609 | A | * | 11/1998 | Dannels et al.| 600/410 |
| 5,869,965 | A | * |  2/1999 | Du et al.     | 324/309 |
| 6,160,397 | A | * | 12/2000 | Washburn et al.| 324/309 |
| 6,341,179 | B1| * |  1/2002 | Stoyle et al. | 382/254 |
| 6,577,126 | B2| * |  6/2003 | Lehr          | 324/307 |
| 7,027,853 | B2| * |  4/2006 | Ma            | 600/410 |

OTHER PUBLICATIONS

R. Bracewell, "The Fourier Transform and Its Applications," McGraw-Hill 1965, pp. 201-202.
H. Bruder et al., "Image Reconstruction for Echo Planar Imaging with Nonequidistant k-Space Sampling," Magnetic Resonance in Medicine 23, 311-323 (1992).
M.H. Buonocore et al., "High Spatial Resolution EPI Using an Odd Number of Interleaves," Magnetic Resonance in Medicine 41:1199-1205 (1999).
M.H. Buonocore et al., "Image-Based Ghost Correction for INterleaved EPI," Magnetic Resonance in Medicine 45:96-108 (2001).
D.L. Foxall et al., "Rapid Iterative Reconstruction for Echo Planar Imaging," Magnetic Resonance in Medicine 42:541-547 (1999).
A. Papoulis, "Signal Analysis," McGraw-Hill 1977, pp. 191-196.

* cited by examiner

*Primary Examiner*—Brij Shrivastav
*Assistant Examiner*—Dixomara Vargas
(74) *Attorney, Agent, or Firm*—Ziolkowski Patent Solutions Group, SC

(57) ABSTRACT

Phase and magnitude correction is performed in two dimensions to reduce ghosting in single shot and multi-shot EPI scans. First, a phase/magnitude correction in the readout direction is carried out to reduce echo shifts and gradient waveform distortions. Then, a two dimensional phase/magnitude correction is performed to remove the remaining xy phase/magnitude errors.

14 Claims, 6 Drawing Sheets

METHOD AND APPARATUS OF MR IMAGING WITH TWO DIMENSIONAL PHASE AND MAGNITUDE CORRECTION

BACKGROUND OF THE INVENTION

The present invention relates generally to a magnetic resonance (MR) imaging and, more particularly, to a method and apparatus for two dimensional phase correction in single shot and multi-shot echo planar imaging (EPI) scans.

EPI sequences are used routinely for a wide variety of clinical and research applications. However, image reconstruction of single and multi-shot EPI is prone to ghost artifacts due to the inconsistency of k-space lines acquired during alternating gradient lobe polarity or during different shots. Currently, a pre-scan with zero phase-encoding gradient is applied before the scan in order to eliminate this artifact. However, this correction cannot remove artifacts associated with inconsistent k-space lines.

The inconsistency between different sets of k-space lines in EPI scans (i.e. lines acquired during negative/positive gradients or during different shots) is caused by magnitude/phase differences between images generated from each of these sets. For a 2D scan, this difference is a function in both the readout (x) and phase encoding (y) directions. This phase/magnitude difference can be attributed to a number of factors. For example, filter delay and short-term gradient distortions that shift the echo center during negative and positive gradient lobes can lead to phase/magnitude differences. These shifts generally depend only on the readout (x) direction. Eddy fields generated by short-term eddy currents in conducting structures near the gradient coil also lead to phase/magnitude differences. The eddy fields are present in both the readout and phase encoding directions. The y or phase encoding dependence may be significant if the gradient coil symmetry is not perfectly axial or if the gradient coil is more distant from the conductive structures in the magnet (i.e. a localized gradient coil). However, even for well-aligned conventional scanners the y dependence of the eddy fields is not negligible. Anisotropy between the x, y or z physical gradient channels of the MR system can cause x and y phase differences during oblique EPI scans. Field inhomogeneity during echo readout can also cause phase differences along the x and y directions. The echo signal is flipped in time during negative gradient lobes, but field inhomogeneity is the same. Hence, phase accumulation due to field inhomogeneity during each readout causes a phase difference in the x and y directions.

Conventional phase/magnitude correction techniques are one-dimensional in nature. That is, the correction corrects for errors only along the readout direction. In this regard, conventional approaches assume that phase errors are independent of phase encoding gradient amplitude. However, as set forth above, phase/magnitude errors are two dimensional in nature, and, therefore, a two-dimensional correction is required.

It would therefore be desirable to have a system and method capable of phase/magnitude correction in more than one direction to reduce ghosting in single shot and multi-shot EPI scans.

BRIEF DESCRIPTION OF THE INVENTION

The present invention provides a system and method of phase/magnitude correction of MR data in the readout and phase encoding directions that overcomes the aforementioned drawbacks.

In accordance with one aspect of the invention, an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. A computer readable storage medium is included that has stored thereon a computer program comprising instructions which when executed by a computer cause the computer to acquire a pre-scan of a region-of-interest with no more than half a phase encoding gradient. The computer is further programmed to calculate a 1D phase correction based on the pre-scan and calculate a 2D phase correction based on the pre-scan. The computer is further programmed to acquire a first set of k-space lines and a second set of k-space lines from the region-of-interest, the first set of k-space lines and the second set of k-space lines shifted from one another in phase. The 1D phase correction is applied on one of the first set of k-space lines and the second set of k-space lines, and the 2D phase correction is applied on the first set of k-space lines and the second set of k-space lines during image reconstruction.

In accordance with another aspect of the invention, the invention is embodied in a computer program stored on a computer readable storage medium and having instructions which, when executed by a computer, cause the computer to segment k-space into a first set and a second set. The first set of k-space is filled with data acquired under a first polarity gradient, and the second set of k-space is filled with data acquired under a second polarity gradient, the second polarity gradient different than the first polarity gradient. The computer is further caused to apply a first phase correction to the first set along a single dimension and apply a second phase correction to the first set of k-space and the second set of k-space along two dimensions to reconstruct an image substantially free of artifacts from the filled k-space.

According to another aspect, the invention includes a method of MR imaging. The method involves the acquisition of reference data from an FOV with a reduced phase encoding gradient and acquisition of imaging data from the FOV with a full phase encoding gradient. The method then determines a one-dimensional phase shift from the reference data and determines a two-dimensional phase shift from the reference data. The imaging data is then corrected for phase errors with the one-dimensional phase shift and the two-dimensional phase shift.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
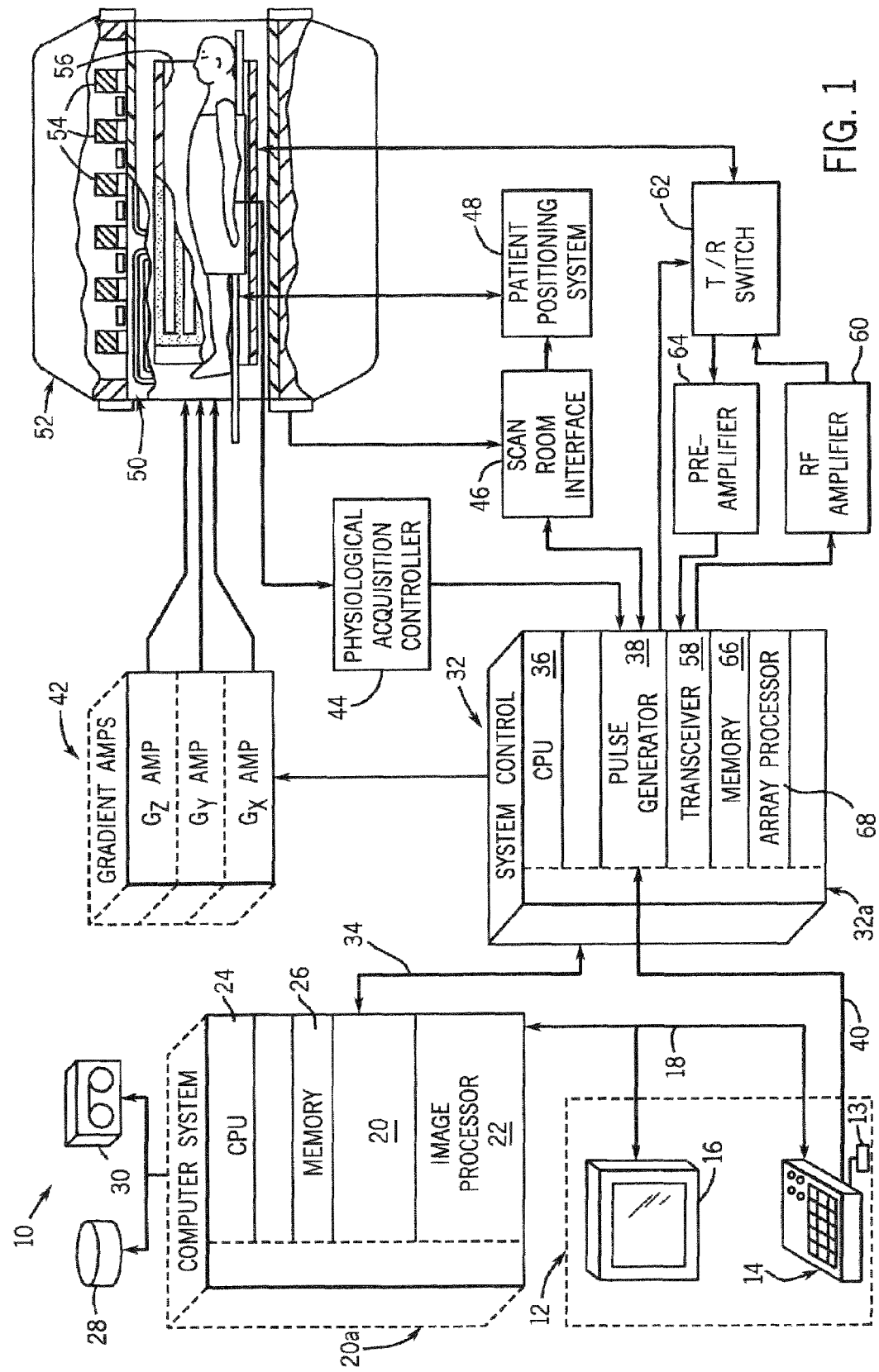
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. Finally, the pulse generator module 38 connects to a scan-room interface circuit 46, which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to a ghost-reducing phase correction technique for EPI scans. The invention is applicable to both single shot and multi-shot EPI studies carried out with an MR system, such as that shown in FIG. 1. For purposes of explanation, the application of the invention to single shot EPI will be described, followed by the application to multi-shot EPI.

For single-shot EPI, odd k-space lines are acquired under a positive gradient and even k-space lines are acquired under a negative gradient. It is conventionally assumed that the acquired 2D data set is row flipped and Fourier transformed (FT) along the x (readout) direction. Hence, data before the second FT in y (phase encoding) direction is referred to as time domain data t, and data after the second FT is referred to as frequency data s.

Figure 2:
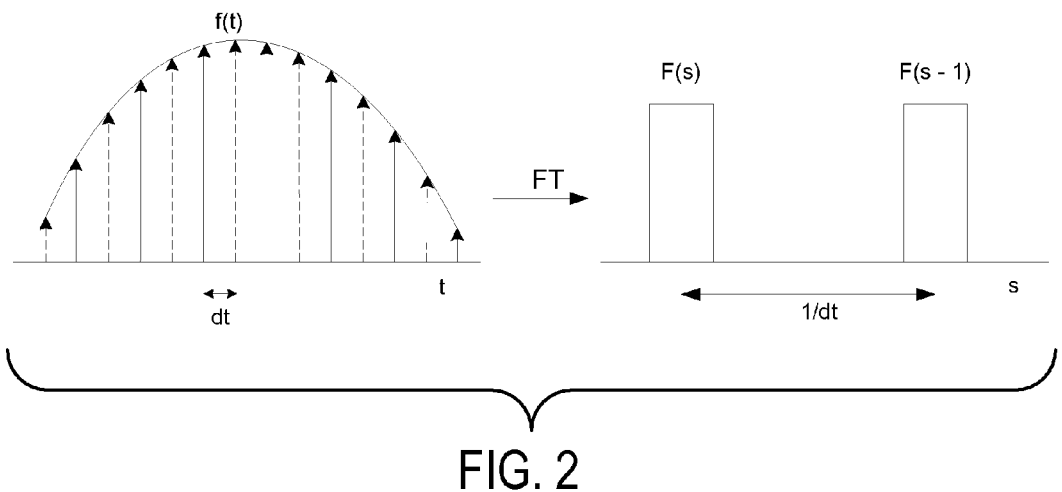
FIG. 2 is a schematic of a band limited function f(t) and its Fourier transform F(s).
Figure 3:
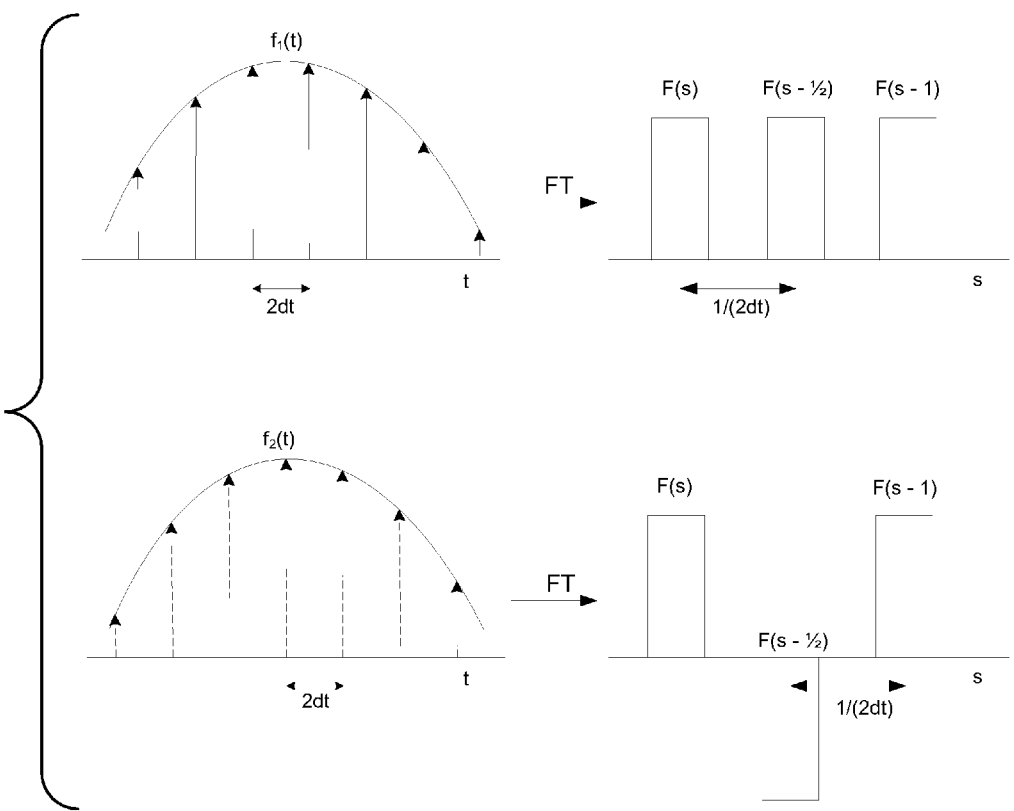
FIG. 3 is a schematic showing separation of f(t) of FIG. 2 into two segments, $f_1(t)$ and $f_2(t)$, and the respective Fourier transforms, $F_1(s)$ and $F_2(s)$.

A band limited sampled function f(t) and its Fourier transform F(s) is shown in FIG. 2. The sampling interval of f(t) is dt, and therefore F(s) is replicated at a distance $\Delta s = 1/dt$. Since there is no object outside $-1/(2 \cdot dt)$ to $1/(2 \cdot dt)$, a true representation of the object is obtained. In FIG. 3, f(t) is separated into $f_1(t)$ and $f_2(t)$, where $f_1$ is f(t) sampled by the even sampling points with zero odd points, and $f_2$ is f(t) sampled by the odd points with zero even points. Since the sampling interval of $f_1$ and $f_2$ is $2 \cdot dt$, the FT of $f_1$ and $f_2$ has a replication at $\Delta s_1 = \Delta s_2 = 1/(2 \cdot dt)$ $2 = 1/(2 \cdot dt)$ from F(s). For simplicity, dt is assumed to be unity, so that $\Delta s_1 = \Delta s_2 = \frac{1}{2}$. The FT of $f_1$ and $f_2$, called $F_1(s)$ and $F_2(s)$, repectively, is a sum of F(s) and its replication $F(s-\frac{1}{2})$. $F(s-\frac{1}{2})$ in $F_2(s)$ is inverted, so that:

$$F_1(s) = F(s) + F(s-\frac{1}{2}) \tag{Eqn. 1 and}$$

$$F_2(s) = F(s) - F(s-\frac{1}{2}) \tag{Eqn. 2}.$$

The full image F(s) and the shifted image F(s−½) are calculated by adding and subtracting $F_1$ and $F_2$. Given that there is a phase/magnitude difference between the ideal $f_2(t)$ (which is consistent with $f_1$) and the actual data sampled by the odd points, which is denoted $f_2(t)$, the FT of $f_1$ and $f_2$ is $F_1(s)$ and $\Im_2(s)$, respectively. Accordingly, the correct F(s) and F(s−½) cannot be separated by adding and subtracting $F_1(s)$ and $\Im_2(s)$. Similarly, for $f_2$ there is a full image $\Im(s)$, which is a sum of $\Im_2(s)$ and its consistent counterpart $\Im_1(s)$:

$$\Im_1(s)=\Im(s)+\Im(s-½) \quad \text{(Eqn. 3) and}$$

$$\Im_2(s)=\Im(s)-\Im(s-½) \quad \text{(Eqn. 4).}$$

Thus, there is a phase/magnitude difference $\Psi_0$ and $\rho$ between the two-artifact-free images F(s) and $\Im(s)$:

$$F(s)=\rho(x,y)\cdot\exp[i\Psi_0(x,y)]\cdot\Im(s) \quad \text{(Eqn. 5).}$$

$\Psi_0$ and $\rho$ depend on x and y. Therefore, one skilled in the art will appreciate the desirability of finding $\Psi_0$ and $\rho$, and converting $\Im_2$ to $F_2$. A (substantially) ghost-free image F(s) can then be obtained by adding $F_1$ and $F_2$.

As one skilled in the art will appreciate, if the object is smaller than half the field-of-view (FOV), there is no overlap between F(s) and F(s−½) (and $\Im(s)$ and $\Im(s-½)$). In this case, F(s−½) (and $\Im(s-½)$) can be zeroed out because it is outside the object. Therefore, $F_1(s)=F_2(s)=F(s)$ and $\Im_2(s)=\Im_1(s)=\Im(s)$. As such, $\Psi_0$ can be found by calculating the phase difference between the acquired data sets $F_1$ and $\Im_2$:

$$\Psi_0(x,y)=\text{angle}(F_1(s)\cdot\Im^*_2(s)) \quad \text{(Eqn. 6) and}$$

$$\rho(x,y)=\|F_1(s)\|/\|\Im_2(s)\| \quad \text{(Eqn. 7),}$$

where "angle" is the full plane arc tangent, * is complex conjugate and $\|\ldots\|$ in Eqn. 7 is magnitude.

To find $\Psi_0$, a reference scan with half the phase encoding amplitude (or with double FOV) and, therefore, half the size of the object along y is carried out. One skilled in the art will appreciate that a reference scan with less than half of the phase encoding amplitude (or with more than double FOV) and, therefore, less than half the size of the object along y may be carried out. $\Psi_0$ and $\rho$ can then be calculated using Eqns. 6 and 7. $\Psi_0(x,y)$ and $\rho(x,y)$ of the full sized object are calculated by interpolation in y because the object dimension along y (in pixels) is exactly twice that of the reference scan. One skilled in the art will appreciate that, in practice, the magnitude correction in Equation Eqn. 7 is negligible, i.e. $\rho(x,y)\approx 1$. Thus, based on $\Psi_0(x,y)$ for the full FOV, $$F(s)=\exp[i\Psi_0(x,y)]\cdot\Im(s) \quad \text{(Eqn. 8).}$$

Shifting Eqn. 8 by one-half FOV yields:

$$F(s-½)=\exp[i\Psi_1(x,y)]\cdot\Im(s-½) \quad \text{(Eqn. 9),}$$

where $\Psi_1$ in Eqn. 9 is $\Psi_0$ shifted by one-half FOV.

During a scan to acquire imaging data, data sets $F_1(s)$ (odd lines with positive gradient) and $\Im_2(s)$ (even lines with negative gradient) with full FOV are acquired. Therefore, F(s) and F(s−½) (or $\Im(s)$ and $\Im(s-½)$) overlap. By using Eqn. 1 and substitution of Eqn. 8 and Eqn. 9 into Eqn. 4:

$$F(s) = \frac{\exp[-i\Psi_1(x,y)]\cdot F_1(s) + \Im_2(s)}{\exp[-i\Psi_1(x,y)] + \exp[-i\Psi_0(x,y)]}. \quad \text{(Eqn. 10)}$$

Using Eqn. 10, the full FOV artifact-free image F(s) from the acquired data sets $\Im_2(s)$ and $F_1(s)$ can be calculated.

In a preferred embodiment, the phase $\Psi_0$ from the double FOV pre-scan is smoothed-out and a mask is employed so that data points with noise are not included. However, one skilled in the art will appreciate that the invention can be implemented without the smoothing and mask operations. In pathological situations where $\Psi_0$ varies very rapidly in space, it is preferred to employ two iterations, i.e., Eqn. 10 is applied once and the phase difference $\Psi_0$ after the correction is calculated again and used again in Eqn. 10. The two-iteration process is believed to be particularly applicable to situations with fast varying phase.

An x phase correction assumes no y dependence, so the same correction is applied to all data lines in the time domain (i.e., before the second FT) or after the second FT. Thus, the band limited sampled function of time f(t) can be separated into an odd sampled function $f_1(t)$ and an even sampled function $f_2(t)$. There exists an even sampled function $f_2(t)$ which is consistent with $f_1$, i.e. the combination $f(t)=f_1(t)+f_2(t)$ is free of ghost artifact. Similarly there is an odd sampled function $f_1(t)$ that is consistent with $f_2(t)$ such that $f(t)=f_1(t)+f_2(t)$ is artifact free. During pre-scan, $f_1(t)$ is acquired (odd lines with positive gradient) as is $f_2(t)$ (even lines with negative gradient). The Fourier transformation of f, $f_1$, $f_2$, f, $f_1$ and $f_2$ can be denoted by F(s), $F_1(s)$, $F_2(s)$, $\Im(s)$, $\Im_1(s)$ and $\Im_2(s)$, respectively. If the phase encoding amplitude during the pre-scan is low enough (i.e., lower or equal to half the phase encode amplitude during the scan) the true image F(s) and its time domain f(t) can be recovered from the even sampled function $f_1(t)$ since the ghost F(s−½) is outside the object and can be zeroed out. Similarly, $\Im(s)$ and its time domain f(t) can be recovered from the even sampled data $f_2(t)$.

Figure 4:
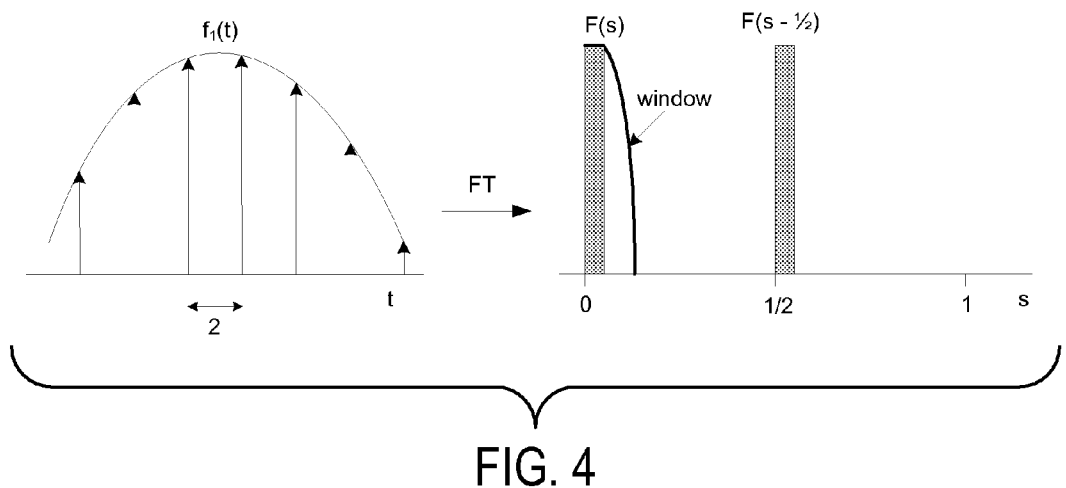
FIG. 4 is a schematic showing recovery of f(x) from $f_1(x)$ with a zero encoding pre-scan.
Figure 5:
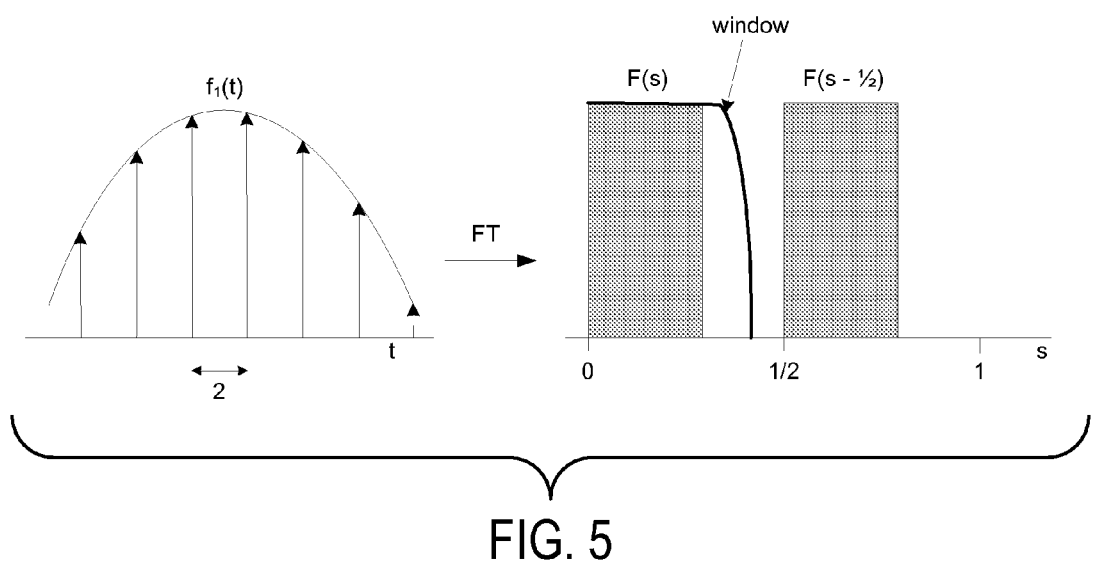
FIG. 5 is a schematic showing recovery of f(x) from $f_1(x)$ with a half-encoding pre-scan.

The process of recovery is demonstrated in FIGS. 4-5 for two types of pre-scans: 1) with zero phase-encode gradient amplitude, the conventional pre-scan (FIG. 4), and 2) with half phase-encoding amplitude (FIG. 5). In both cases, F(s−½) is filtered out with a smooth window. In the time domain, this is equivalent to convolution or interpolation with a narrow kernel. Therefore, in both cases, interpolation in the time domain or FT with a smooth filter and inverse FT to find the even lines $f_2$ (even lines with positive gradient) that are consistent with the odd lines with positive gradient $f_1$ can be used. The phase difference $\alpha(x)$ between the calculated even lines $f_2(t)$ and the acquired even lines $f_2(t)$, which is assumed to be the same for all the even lines, is calculated from the time domain even line with the strongest signal:

$$f_2(t)=\exp[i\alpha(x)]\cdot f_2(t) \quad \text{(Eqn. 11).}$$

The phase difference $\alpha(x)$ calculated from the pre-scan data is added to all the even lines in the scan in order to obtain a ghost-free consistent image. This x phase correction is efficient and robust, because it does not assume linear phase. The phase correction performs interpolation, rather than phase calculation and fitting to a straight line.

Figure 6:
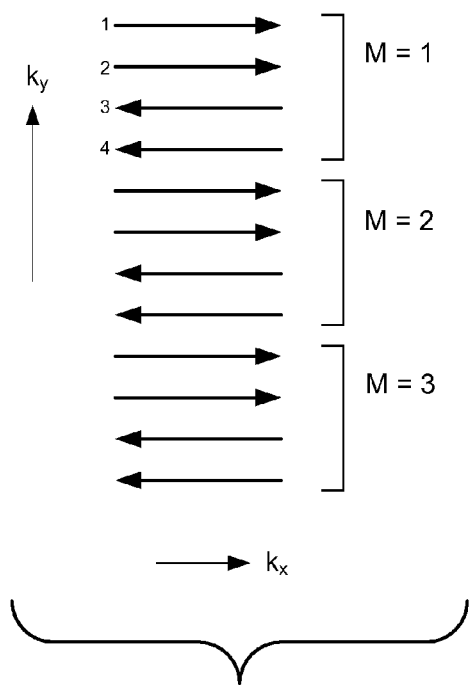
FIG. 6 is a schematic showing one k-space coverage for a multi-shot EPI scan with two shots.
Figure 7:
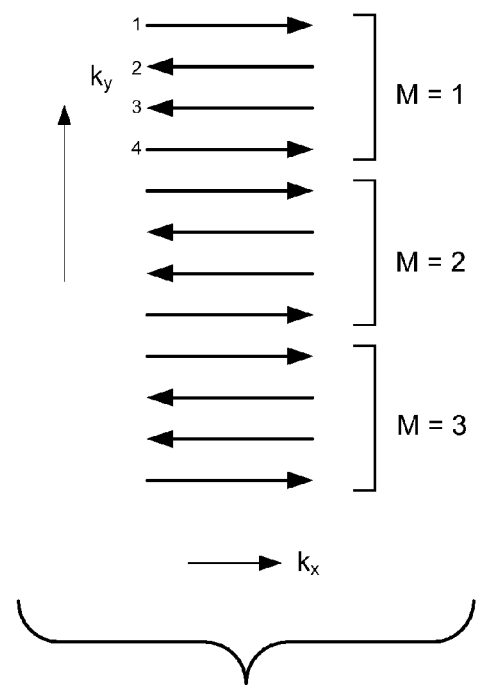
FIG. 7 is a schematic showing another k-space coverage for a multi-shot EPI scan with two shots.

As referenced above, the invention is applicable to single shot and multi-shot EPI. Application of the invention to multi-shot EPI follows. The k-space coverage for a multi-shot EPI with L shots is demonstrated in FIGS. 6-7. The number of lines acquired is $N=2\cdot L\cdot M$, where N is the number of lines, L the number of shots and M is any integer. In FIG. 6, L=2 shots and N=12. The k-space data comprises M=3 chunks with 2L=4 lines in each. In each chunk, there are L lines acquired with a positive gradient (time axis from left to right), and L lines acquired with a negative gradient (time axis from right to left). The first L lines in each chunk can have any polarity, but the second L lines in each chunk have opposite polarity. In FIG. 6, the first two lines are positive and therefore the next two lines in each chunk are negative. In FIG. 7, the first two lines are positive, negative. Therefore, the next two lines have opposite polarity, i.e. negative, positive. Thus, any multi-shot scan can be fully characterized by the first L positive lines in k-space. For example, in FIG. 6, the first L=2 positive lines are at [1, 2] and in FIG. 7, they are at [1, 4].

To reconstruct an image substantially free of ghosts typically associated with inconsistency between data lines, a reference scan is carried out with double FOV (half phase encode gradient). This is sufficient to find the phase $\Psi_0(x, y)$ for any arbitrary number of shots L. To find $\Psi_0$, the regularly spaced k-space lines at 1, 3, 5, 7, ... with positive gradient polarity, i.e. the function $f_1(t)$, are reconstructed. In contrast to single-shot EPI, for multi-shot, the positive gradient lines are irregularly sampled. For example in FIG. 6 the positive lines are at 1, 2, 5, 6 ...

Figure 8:
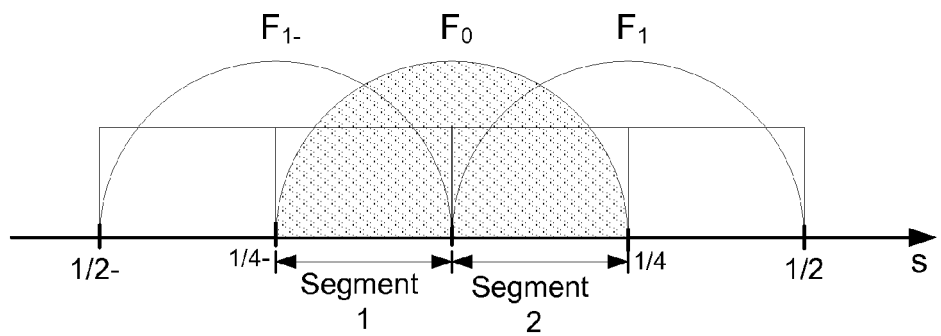
FIG. 8 is a schematic showing segmentation of a double FOV pre-scan for a multi-shot EPI scan with two shots.

As shown in FIG. 6, assuming L=2, the positive-polarity lines are sampled at k=1, 2, 5, 6, .... This sampling can be written as a sum of two regularly spaced sampling functions at 1, 5, 9, 13, ... and 2, 6, 10, 14, .... The spacing between adjacent samples is 4 points. A sampling function $\Im_n$ is defined as the time domain function f(t) sampled regularly from ky line n with spacing of 2L lines. Therefore, the two sampling function in FIG. 6 (at ky=1, 5, 9 ... and ky=2, 6, 10 ... ) are $III_1$ and $III_2$. The FT of $III_1$ and $III_2$ is denoted $\mathfrak{R}_1$ and $\mathfrak{R}_2$, repectively. Since the sampling interval is 4, $\mathfrak{R}_1$ and $III_2$ are sums of the true object, replicated at 0, ±FOV/4, ±FOV/2 etc. Assuming the sampling interval is unity, the original image is denoted F(s) and the replicated images are F(s±¼), F(s±½), etc. FIG. 8 shows $\mathfrak{R}_1$ vs. s. To simplify notation, F(s−m·¼) is denoted as $F_m$, where m is an integer. For example, F(s) is $F_0$, F(s−¼) is $F_1$, etc. For L=2, the FOV in FIG. 8 is divided into 2L=4 segments. Since this is a double FOV scan, the original object F(s) occupies only two segments, segment 1 and segment 2, from s=−¼ to s=¼. As shown in FIG. 8, image replicas $F_0$ and $F_{-1}$ are present in segment 1, and $F_0$ and $F_1$ are present in segment 2. Since $III_1$ and $III_2$ are shifted in time, the phase of $F_1$ (and $F_{-1}$) in $\mathfrak{R}_1$ and $\mathfrak{R}_2$ is different whereas the phase of $F_0$ is unchanged. Using a generalized sampling theorem, such as that described in "Signal analysis," Papoulis, 1977, pgs. 191-196, and "The Fourier transform and its applications," Bracewell, 1965, pgs. 201-202, the aforementioned can be written in matrix form:

$$\begin{pmatrix} 1 & 1 \\ 1 & -i \end{pmatrix}\begin{pmatrix} F_0 \\ F_{-1} \end{pmatrix} = \begin{pmatrix} R_1 \\ R_2 \end{pmatrix} \text{ in segment 1 and} \quad (\text{Eqn. 12})$$

$$\begin{pmatrix} 1 & 1 \\ 1 & i \end{pmatrix}\begin{pmatrix} F_0 \\ F_1 \end{pmatrix} = \begin{pmatrix} R_1 \\ R_2 \end{pmatrix} \text{ in segment 2.} \quad (\text{Eqn. 13})$$

$F_0$ can be found in segments 1 and 2 as a linear combination of $\mathfrak{R}_1$ and $\mathfrak{R}_2$.

Calculation of the double FOV image F(s) from ky lines with a positive gradient is as described above. In order to find $\Psi_0$, the double FOV image $\Im(s)$ from lines sampled under a negative gradient must be calculated. From FIG. 6, the sampling functions are $\Im_3$ and $\Im_4$ because they start at k space lines 3 and 4 with FT $\mathfrak{R}_3$ and $\mathfrak{R}_4$. Using the same analysis:

$$\begin{pmatrix} 1 & -1 \\ 1 & i \end{pmatrix}\begin{pmatrix} \Im_0 \\ \Im_{-1} \end{pmatrix} = \begin{pmatrix} R_3 \\ R_4 \end{pmatrix} \text{ in segment 1 and} \quad (\text{Eqn. 14})$$

$$\begin{pmatrix} 1 & -1 \\ 1 & -i \end{pmatrix}\begin{pmatrix} \Im_0 \\ \Im_1 \end{pmatrix} = \begin{pmatrix} R_3 \\ R_4 \end{pmatrix} \text{ in segment 2,} \quad (\text{Eqn. 15})$$

where $\Im_0$ is calculated as a linear combination of $\mathfrak{R}_3$ and $III_4$.

Finally, $\Psi_0$ is calculated as in Eqn. 6 as:

$$\Psi_0(x, y) = \text{angle}(F_0(s) \cdot \Im^*_0(s)) \quad (\text{Eqn. 16}),$$

and then interpolated to a full FOV.

One skilled in the art will appreciate that the above description of the present invention to L=2 is exemplary and that the invention is not so limited. For L shots, the FOV in FIG. 8 can be divided into 2L segments extending from s=−½ to s=½. To simplify notation, a new variable η=s·2L is defined, so that the FOV extends from η=−L to L, and each segment length on the η axis is unity. The one-half FOV object extends from η=−L/2 to L/2 and contains L segments. Within each segment, there are L image replicas $F_m$. According to FIG. 8, $F_m$ is the true image F, shifted along the η axis by m, where m is an integer:

$$F_m = F(\eta - m) \quad (\text{Eqn. 17}),$$

where F(η) is the original half FOV image. In general, within each segment k there are $F_m$ with m=k−L to k−1, where k is the segment index, k=1, 2, ..., L. For example, in FIG. 8, L=2, m=(−1, 0) and (0, 1) for segments k=1 and 2, respectively.

Equation 12 can be generalized for any L. In matrix representation, for any given segment:

$$A \cdot F_m = \mathfrak{R}_P \quad (\text{Eqn. 18}),$$

where $\mathfrak{R}_P$ is a column vector containing the FT of L sampling functions $\Im_P$, where P are the indices of the first L ky lines with positive gradient. $F_m$ is a column vector with L elements, containing the image replicas within a given segment. As described above, m is the vector (k−L, k−L+1, ..., k−1) for the segment k, where k=1 to L. From the generalized sampling theorem, the matrix A is an L-by-L matrix whose i,j entry $A_{i,j}$ is:

$$A_{ij} = \exp[i \cdot (d_i - 1) \cdot m_j \cdot \pi / L] \quad (\text{Eqn. 19}),$$

where $d_i$ is element i of d, which is a vector containing the line numbers of the first L positive lines, and where m, as explained above, is the vector (k−L, k−L+1, ..., k−1) for the segment k, where k=1 to L. For example, in FIG. 6, d=[1, 2], and m=[0, −1] for segment 1 and m=[0, 1] for segment 2.

For the k-space lines acquired with negative gradient polarity, in matrix form:

$$B \cdot \Im_m = \mathfrak{R}_N \quad (\text{Eqn. 20}),$$

where $\mathfrak{R}_N$ is the FT of the L sampling functions $\Im_N$, where N are the indices of the first L lines with negative gradient polarity. B has the same expression as A in Eqn. 19, but the vector d contains line numbers of the first L negative k-space lines. For FIG. 6, d=[3, 4]. The final double FOV images $F_0$ and $\Im_0$ are obtained by inverting matrices A and B, per the following expression:

$$F_m = A^{-1} \cdot \Re_P \text{ and } \Im_m = B^{-1} \cdot \amalg_N \quad \text{(Eqn. 21).}$$

The phase $\Psi_0(x, y)$ is calculated from Eqn. 16 and interpolated to a full FOV.

The double FOV reference-scan and Eqns. 18 and 20 can also be used to perform an x phase correction. In this case, the phase $\Psi_0$ is independent of y, and, therefore, Eqns. 20 and 18 are used in the time domain. The sampling functions $\Im_P$ and $\Im_N$ (instead of its Fourier transform $\Re_P$ and $\Re_N$) are used to calculate $T_0$ and $\tau_0$, the time domain of $F_0$ and $\Im_0$, respectively:

$$A \cdot T_m = \Im_P \text{ and}$$

$$B \tau_m = \Im_N,$$

where A, B, $\Im_N$ and $\Im_P$ are the same as in Eqns. 18 and 20. $\tau_0$ and $T_0$ are obtained by inverting A and B. $\Psi_0(x)$ is the phase difference between the line of the strongest signal in $\tau_0$ and $T_0$. The image is phase corrected by applying the phase difference $\Psi_0(x)$ in the time domain to the lines acquired with a negative gradient.

As described herein, the present invention is directed to the reconstruction of substantially ghost-free images. In this regard, the known phase $\Psi_0(x, y)$ determined in a manner described above is applied to imaging data with full FOV in order to eliminate ghosts from that imaging data. In the next paragraphs, a general formula is described to correct images with any number of shots L.

Figure 9:
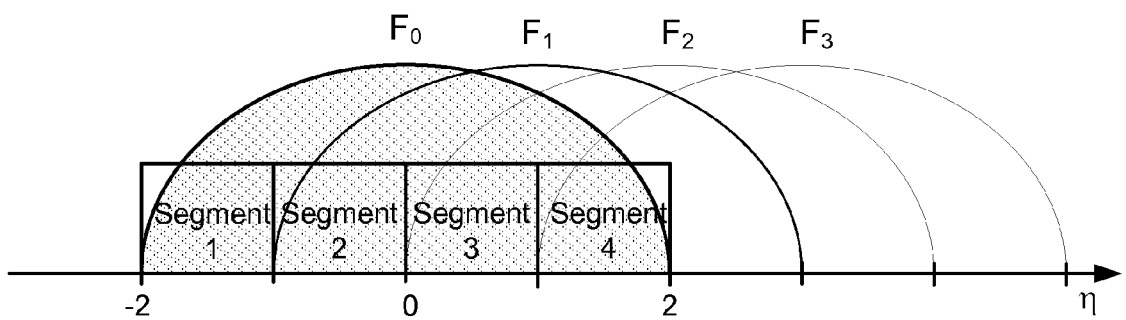
FIG. 9 is a schematic showing Fourier transformation of a full FOV multi-shot EPI scan with two shots.

A full FOV image $F_0(\eta)$ is shown in FIG. 9 for a scan with L=2 shots. As before, the time domain data can be written as a sum of the 2L=4 sampling functions $\Im_1, \Im_2, \Im_3$ and $\Im_4$. As shown in FIGS. 6 and 7, two of these functions are sampled with a negative gradient and two with a positive gradient. The Fourier transform of these sampling functions are $\Re$ and $\Re_4$, respectively. FIG. 9 shows, schematically, the FT $\Re$ of any of the four sampling functions III The variable on the abscissa is $\eta = s \cdot 2L$, so the full FOV image $F_0$ extend from $\eta=L$ to $\eta=-L$. There are 2L=4 segments, and there are 4 image replicas $F_m$ in each segment. In general, in any segment k, there are 2L image replicas $F_m$, with m=k-2L to k-1, where k=1 to 2L. In FIG. 9, for example, segment k=4 contains four $F_m$ with m=(0, 1, 2, 3). For the sampling functions sampled with a negative read gradient, all the image replicas $F_m$ in FIG. 9 must be replaced by $\Im_m$. Since the phase difference between $F_0$ and $\Im_0$ is $\Psi_0(x, y)$ the phase difference between $F_m$ and $\Im_m$ is given by:

$$F_m(x, y) = \exp[i\Psi_m(x, y)] \cdot \Im_m(x, y) \quad \text{(Eqn. 22),}$$

where $\Psi_m$ is $\Psi_0$ shifted by $m \cdot FOV/(2L)$ along the y-axis to yield:

$$\Psi_m(x, y) = \Psi_0[x, y - m \cdot FOV/(2L)] \quad \text{(Eqn. 23) and}$$

$$\Psi_m(\eta) = \Psi_0(\eta - m) \quad \text{(Eqn. 24).}$$

Using the sampling pattern of FIG. 6, where $\amalg_1$ and $\amalg_2$ are sampled with a positive gradient and $\amalg_3$ and $\amalg_4$ with a negative gradient, $F_m$ must be replaced with $\Im_m$ in $\amalg_3$ and $\amalg_4$ using Eqn. 22. $F_m$ is then solved for in each segment as in Eqns. 18 and 20. For segment 1 in FIG. 9, where k=1 and m=(-3, -2, -1, 0):

$$\begin{pmatrix} 1 & 1 & 1 & 1 \\ i & -1 & -i & 1 \\ -C_{-3} & C_{-2} & -C_{-1} & C_0 \\ -iC_{-3} & -C_{-2} & iC_{-1} & C_0 \end{pmatrix} \begin{pmatrix} F_{-3} \\ F_{-2} \\ F_{-1} \\ F_0 \end{pmatrix} = \begin{pmatrix} \Re_1 \\ \Re_2 \\ \Re_3 \\ \Re_4 \end{pmatrix}. \quad \text{(Eqn. 25)}$$

For segment 4 (k=4) where m=(0, 1, 2, 3):

$$\begin{pmatrix} 1 & 1 & 1 & 1 \\ 1 & i & -1 & -i \\ C_0 & -C_1 & C_2 & -C_3 \\ C_0 & -iC_1 & -C_2 & iC_3 \end{pmatrix} \begin{pmatrix} F_0 \\ F_1 \\ F_2 \\ F_3 \end{pmatrix} = \begin{pmatrix} \Re_1 \\ \Re_2 \\ \Re_3 \\ \Re_4 \end{pmatrix}, \quad \text{(Eqn. 26)}$$

where $C_m = \exp[-i\Psi_m(x, y)]$, such that $\Im_m = C_m \cdot F_m$. $F_0$ is obtained by inverting Eqn. 25 and Eqn. 26. The solution of $F_0$ in terms of $C_m$ is the same for Eqn. 25 and Eqn. 26 and for all the segments k, due to the cyclic nature of $C_m$ and $F_m$, i.e. $C_m = C_{m \pm 2L}$, and $F_m = F_{m \pm 2L}$. Therefore the matrix defined by Eqn. 26 holds for all the segments k=1 to 4.

Equation 26 can be generalized for any L by writing it in matrix form:

$$M \cdot F_m = \Re \quad \text{(Eqn. 27),}$$

$$\text{where } M = A \cdot P \quad \text{(Eqn. 28).}$$

$F_m$ (with m=0 to 2L-1) and III in Eqn. 27 are column vectors of length 2L as in Eqns. 25-26. M, A and P in Eqns. 27-28 are 2L-by-2L matrices. The matrix multiplication sign · in Eqn. 28 means element-by-element multiplication. The matrix A in Eqn. 28 is defined as (compare to Eqn. 19):

$$A_{ij} = \exp[i \cdot (d_i - 1) \cdot m_j \cdot \pi/L] \quad \text{(Eqn. 29).}$$

The vector d in Eqn. 29 is d=1 to 2L, and the vector m, as shown in Eqn. 26, is m=0 to 2L-1. The matrix P in Eqn. 28 is the phase correction matrix. The rows of P that correspond to the first L lines sampled with a positive gradient are all 1, and the rows that correspond to lines sampled with a negative gradient are the vector $C_m$ with m=0 to 2L-1. For example, P in Eqn. 26, where the first two lines are positive and lines 3 and 4 are negative, is:

$$P = \begin{pmatrix} 1 & 1 & 1 & 1 \\ 1 & 1 & 1 & 1 \\ C_0 & C_1 & C_2 & C_3 \\ C_0 & C_1 & C_2 & C_3 \end{pmatrix}. \quad \text{(Eqn. 30)}$$

The desired artifact free image $F_0$ is calculated by inverting M in Eqn. 28. Equations 27-28 provide a general solution for EPI reconstruction with any arbitrary shots L.

Figures 10, 11:
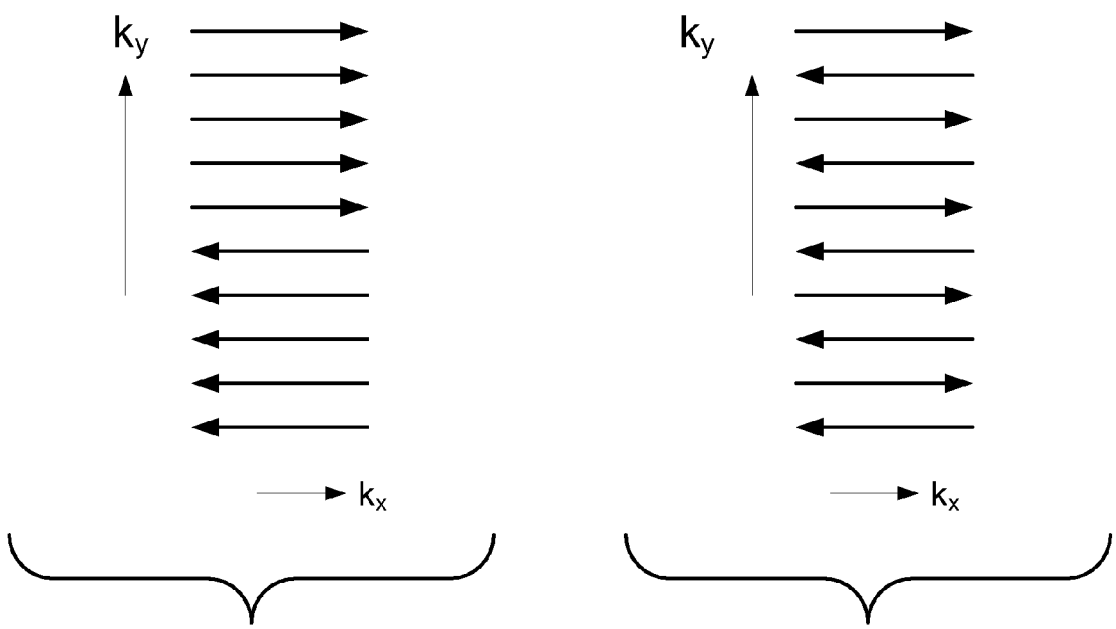
FIG. 10 is a schematic showing one k-space coverage for a multi-shot EPI scan with five shots.
FIG. 11 is a schematic showing another k-space coverage for a multi-shot EPI scan with five shots.

FIGS. 10 and 11 show two different sampling patterns with L=5 shots. In FIG. 10, the read gradient polarity is the same for all shots, whereas in FIG. 11, the polarity alternates between shots. In FIG. 11, the positive lines (and the negative lines) are equidistant, exactly as with single shot acquisition. In FIG. 10, the positive (and negative) lines are bunched together in separate groups. For an acquisition with alternate gradient polarity and even number of shots, the gradient polarity alternates, but the positive (and negative) lines are not equidistant as FIG. 7 (with alternate polarity and L=2 shots) shows. When the double FOV pre-scan is processed (Eqns. 18 and 20), the lines with positive polarity are re-sampled to a regular grid of 1, 3, 5, 7, . . . . Since the same polarity sampling of FIG. 10 bunches the positive lines into separate groups of L lines, the re-sampling into a regular grid causes significant noise amplification for L>3. In this case, the calculated phase $\Psi_0$ is noisy, resulting in image artifacts. To avoid this we restrict same polarity sampling to L<4. With alternate polarity sampling, noise amplification is negligible since all lines with a given gradient polarity are close to each other as shown in FIG. 11.

In fast imaging applications, where very short reconstruction time is required, the calculation time required to correct the phase of the image using Eqns. 27 and 28 may exceed a desired threshold. The matrix M in Eqn. 28 is position dependent since it includes the position dependent phase $\Psi_0(x, y)$. Therefore, to calculate $F_0$ in Eqn. 27, matrix M must be inverted for each pixel in the image, which is time consuming. An analytic expression for $F_0$ from Eqn. 27 may be derived such that the inversion of matrix M is not required. Such an expression can be derived for L=1 (Eqn. 10), L=2 and L=3 in case same polarity sampling (FIG. 10). Alternate polarity sampling with an odd number of shots is equivalent to single shot (Eqn. 10) and, therefore, can be calculated analytically. For alternate polarity sampling with an even number of shots, matrix M must be inverted for each pixel in the image. Image reconstruction in terms of phase accuracy and calculation time vs. L for various sampling patterns is summarized in Table 1.

TABLE 1

| Gradient polarity between shots | Number of Shot L | | Phase map accuracy | Calculation time |
|---|---|---|---|---|
| Same polarity | L ≦ 3 | | Accurate | Fast |
|  | L > 3 | | Noisy | Time consuming |
| Alternate polarity | L ≦ 3 | | Accurate | Fast |
|  | L > 3 | L odd | Accurate | Fast |
|  |  | L even | Accurate | Time consuming |

Figure 12:
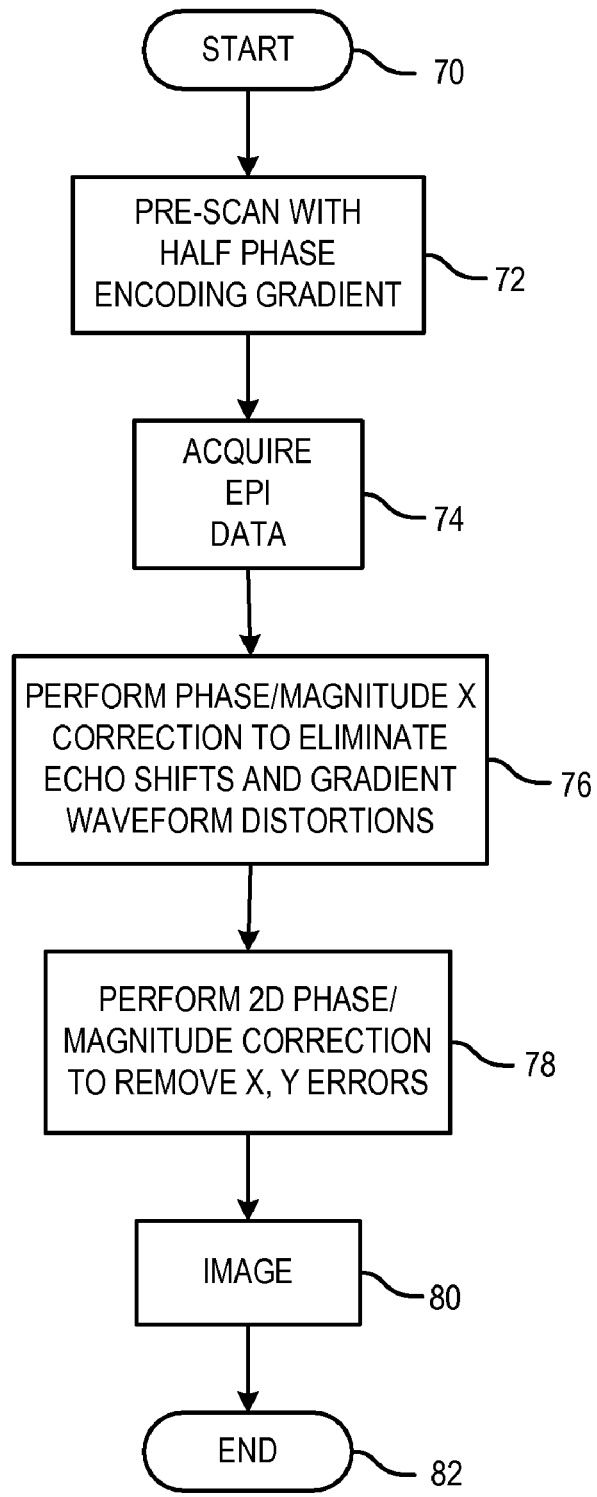
FIG. 12 is a flow chart setting forth the steps of an EPI scan according to one aspect of the invention.

The phase and magnitude correction process, according to one aspect of the invention, is summarized in FIG. 12. First, an EPI scan begins at 70 with a pre-scan with half the phase encoding gradient being carried out 72 to find a phase shift value. EPI data is then acquired at 74. Phase and magnitude x correction is then performed 76 on the EPI data, in a manner described above, to eliminate large echo shifts and gradient waveform distortions in the EPI data. Xy correction is then performed 78 on the EPI data using Eqns. 27 and 28 and the technique described with respect thereto to correct the remaining 2 dimensional (2D) xy phase and magnitude errors. After this correction, an image substantially free of ghosting typically associated with data line inconsistency is reconstructed 80. The process then ends at 82.

Therefore, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. A computer readable storage medium is included that has stored thereon a computer program comprising instructions which when executed by a computer cause the computer to acquire a pre-scan of a region-of-interest with no more than half a phase encoding gradient. The computer is further programmed to calculate a 1D phase correction based on the pre-scan and calculate a 2D phase correction based on the pre-scan. The computer is further programmed to acquire a first set of k-space lines and a second set of k-space lines from the region-of-interest, the first set of k-space lines and the second set of k-space lines shifted from one another in phase. The 1D phase correction is applied on one of the first set of k-space lines and the second set of k-space lines, and the 2D phase correction is applied on the first set of k-space lines and the second set of k-space lines during image reconstruction.

The invention further includes a computer readable storage medium having stored thereon a computer program for MR imaging and representing instructions that when executed by a computer causes the computer to segment k-space into a first set and a second set. The first set of k-space is filled with data acquired under a first polarity gradient, and the second set of k-space is filled with data acquired under a second polarity gradient, the second polarity gradient different than the first polarity gradient. The computer is further caused to apply a first phase correction to the first set along a single dimension and apply a second phase correction to the first set of k-space and the second set of k-space along two dimensions to reconstruct an image substantially free of artifacts from the filled k-space.

The invention further includes a method of MR imaging. The method involves the acquisition of reference data from an FOV with a reduced phase encoding gradient and acquisition of imaging data from the FOV with a full phase encoding gradient. The method then determines a one-dimensional phase shift from the reference data and determines a two-dimensional phase shift from the reference data. The imaging data is then corrected for phase errors with the one-dimensional phase shift and the two-dimensional phase shift.

The present invention has been described in terms of the preferred embodiment, and it is recognized that equivalents, alternatives, and modifications, aside from those expressly stated, are possible and within the scope of the appending claims.

What is claimed is:

1. An MR system comprising:
    a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
    a computer readable storage medium having stored thereon a computer program comprising instructions which when executed by a computer cause the computer to:
        acquire a pre-scan of a region-of-interest with no more than half a phase encoding gradient;
        calculate a 1D phase correction based on the pre-scan;
        calculate a 2D phase correction based on the pre-scan;
        acquire a first set of k-space lines and a second set of k-space lines from the region-of-interest, the first set of k-space lines and the second set of k-space lines shifted from one another in phase;
        apply the 1D phase correction on one of the first set of k-space lines and the second set of k-space lines; and
        apply the 2D phase correction on the first set of k-space lines and the second set of k-space lines during image reconstruction.

2. The MR system of claim 1 wherein the computer is further programmed to acquire the first set and the second set of k-space lines with EPI readout.

3. The MR system of claim 2 where the EPI readout includes either single-shot EPI or multi-shot EPI.

4. The MR system of claim 1 wherein the computer is further programmed to:
calculate a 1D magnitude correction based on the pre-scan; and
apply the 1D magnitude correction on one of the first set of k-space lines and the second set of k-space lines.

5. The MR system of claim 4 wherein the computer is further programmed to:
calculate a 2D magnitude correction based on the pre-scan; and
apply the 2D magnitude correction on the first set of k-space lines and the second set of k-space lines.

6. The MR system of claim 1 wherein the computer is further programmed to apply the 1D phase correction to correct for at least one of filter delay and short-term gradient distortions that shift echo center during negative and positive gradients played out to spatially encode the first set and the second set of k-space lines.

7. The MR system of claim 1 wherein the computer is further programmed to apply the 2D phase correction to correct for errors attributed to eddy fields generated by short-term eddy currents in conducting structures near the gradient coil.

8. The MR system of claim 1 wherein the computer is further programmed to apply the 2D phase correction to correct for anisotropy between x, y, or z, gradient channels that causes x and y phase differences during oblique EPI scans.

9. The MR system of claim 1 wherein the computer is further programmed to apply the 2D phase correction to correct for phase differences in readout and phase encoding directions associated with field inhomogeneity during readout.

10. The MR system of claim 1 wherein the computer is further programmed to acquire the first set and the second set of k-space lines from the region-of-interest with full encoding in the phase encoding direction.

11. The MR system of claim 1 wherein the computer is further programmed to apply the 1D phase correction with one of the first set of k-space lines and the second set of k-space lines in the time domain.

12. The MR system of claim 1 wherein the computer is further programmed to apply the 2D phase correction with the first set and the second set of k-space lines in the image domain.

13. A computer readable storage medium having stored thereon a computer program for MR imaging and representing instructions that when executed by a computer causes the computer to:
acquire reference data lines in a pre-scan;
segment k-space into a first set and a second set;
fill the first set of k-space with data acquired under a first polarity gradient;
fill the second set of k-space with data acquired under a second polarity gradient, the second polarity gradient different than the first polarity gradient;
determine first and second phase corrections based on the reference data lines;
apply the first phase correction to the first set along a single dimension; and
apply the second phase correction to the first set of k-space and the second set of k-space along two dimensions to reconstruct an image substantially free of artifacts from the filled k-space;
wherein the reference data lines are acquired from at least double a full FOV, and wherein the data for the first set of k-space and the second set of k-space is acquired from the full FOV; and
store the image in computer memory.

14. A method comprising the steps of:
acquiring reference data from an FOV with a reduced phase encoding gradient;
acquiring imaging data from the FOV with a full phase encoding gradient;
determining a one-dimensional phase shift from the reference data;
determining a two-dimensional phase shift from the reference data;
correcting the imaging data for phase errors with the one-dimensional phase shift and the two-dimensional phase shift;
wherein the step of acquiring reference data further comprises acquiring the reference data from at least double the FOV; and
storing the corrected image data in computer memory.

* * * * *